(12) United States Patent
Nash et al.

(10) Patent No.: US 6,317,590 B1
(45) Date of Patent: Nov. 13, 2001

(54) MIXER FOR A RECEIVER

(75) Inventors: Adrian P. Nash; Sean Brett, both of Surrey (GB)

(73) Assignee: Nokia Mobile Phones, Ltd., Espoo (FI)

( * ) Notice: Subject to any disclaimer, the term of this patent is extended or adjusted under 35 U.S.C. 154(b) by 0 days.

(21) Appl. No.: 09/213,063

(22) Filed: Dec. 16, 1998

(30) Foreign Application Priority Data

Dec. 23, 1997 (GB) .................................................... 9727321
May 29, 1998 (GB) .................................................... 9811673

(51) Int. Cl.⁷ .................................................... H04B 1/26
(52) U.S. Cl. .................. 455/331; 455/333; 455/318; 455/326
(58) Field of Search ................ 455/318, 319, 455/325, 326, 327, 328, 329, 330, 331, 333

(56) References Cited

U.S. PATENT DOCUMENTS

| | | | |
|---|---|---|---|
| 3,983,489 | 9/1976 | Gittinger | 325/449 |
| 4,485,488 | 11/1984 | Houdart | 455/327 |
| 5,001,372 | 3/1991 | Nyqvist | 307/529 |
| 5,113,094 | 5/1992 | Grace et al. | 307/529 |
| 5,265,266 | * 11/1993 | Trinh | 455/326 |
| 5,379,458 | 1/1995 | Vaisanen | 455/330 |
| 5,428,840 | * 6/1995 | Sadhir | 455/330 |
| 5,430,895 | 7/1995 | Huusko | 455/327 |
| 5,831,303 | 11/1998 | Rapeli | 257/316 |

FOREIGN PATENT DOCUMENTS

| | | |
|---|---|---|
| 26 54 224 A1 | 6/1978 | (DE) . |
| 0 581 573 A1 | 2/1994 | (EP) . |
| 868995 | 5/1961 | (GB) . |
| 2284116 A | 5/1995 | (GB) . |

OTHER PUBLICATIONS

"Fundamental, Harmonic and Sampling Mesfet Mixer Circuits" D. Neuf, Microwave Journal, vol. 38, No. 12, Dec. 1, 1995, PP 76, 78, 80, 82, 86.

"A Subharmonically Pumped Resistive Dual–Hemt–Mixer" H. Zirath, MTT–S International Microwave Symposium Digest, Boston, Jun. 1991, vol. 2, pp. 875–878.

PCT International Search Report.

* cited by examiner

*Primary Examiner*—Vivian Chang
*Assistant Examiner*—Lester Kincaid
(74) *Attorney, Agent, or Firm*—Perman & Green, LLP

(57) ABSTRACT

A sub-harmonically pumped mixer has an anti-parallel diode pair switchable at twice the local oscillator frequency. Preferably, there are provided dual anti-parallel diode pairs. The local oscillator is coupled to the diode pairs by means of an unbalanced to balanced transformer. The balanced output of the transformer is coupled to the diodes and provides anti-phased signals to respective ones of anti-parallel diode pairs.

13 Claims, 4 Drawing Sheets

MIXER FOR A RECEIVER

BACKGROUND OF INVENTION

The present invention relates to a mixer for a receiver for a portable radio communication apparatus, and in particular to a mixer for a direct conversion receiver.

A general trend in portable communication apparatus is the reduction in volume, weight and power consumption of such apparatus. This has led to efforts towards reducing the number of elements and devices necessary to perform the functions associated with portable communication devices. In particular, the radio frequency front end of portable apparatus, which typically comprises a number of down-converting stages, is an area in which a reduction in the number of elements and devices would be beneficial.

One approach to reduce the number of stages in the radio frequency front-end is to convert a received radio frequency carrier signal down to Van Intermediate Frequency (IF) in a single step. This is termed direct conversion and is carried out in receivers known by any one of the terms homodyne or zero IF receivers, as well as direct conversion receivers. To carry out direct conversion, a local oscillator signal (LO) having the same frequency as the radio frequency carrier signal (ie. the LO is "on-channel") is mixed with the carrier signal in a suitable non-linear device such as a mixer diode. The output of the mixer contains the sum and difference of the LO and the carrier signal. Thus a mixer product exists at twice the carrier signal, and also at DC (zero Hz). The high frequency mixer products can be filtered by a suitable low pass filter. Once the radio frequency carrier signal has been down-converted, the modulating signal may be de-modulated using an appropriate demodulator, e.g. an I/Q demodulator for an I/Q modulating signal.

In the field of radio telephony, particularly cellular telephony, use of a direct conversion receiver is not without certain drawbacks.

Radio telephones operating in the same cell of a cellular telephone network typically receive control signals on the same signal frequency as each other. This is necessary since such control signals are often so-called "broadcast" control signals such as paging signals which need to be received by all the telephones operating in the same cell. Signals received by radio telephones are of very low power, e.g. below −100 dBm and the sensitivity of the receivers is adapted accordingly.

Against the requirement for radio telephones in the same cell to be tuned to common frequencies, the introduction of direct conversion receivers with their strong on-board LO signals present the problem of interference. More specifically, spurious LO leakage from the receiver into the antenna can cause in-band interference with other nearby receivers tuned to the same channel. Therefore, such a receiver would require a very high level of isolation between the local oscillator and the antenna in order to avoid swamping or saturating receivers of any nearby radio telephones. Such high levels of isolation are very difficult to achieve due to stray capacitances directly coupling local oscillator energy into the antenna. This is the case even when conventional mixers such as a Gilbert cell is used.

Known methods addressing the problem of LO leakage include:
  providing increased reverse-isolation in the RF path to the antenna, for example introducing multi-stage RF amplifiers,
  inserting an isolator,
  reducing the local oscillator drive power to very low levels.

However, these methods have shortcomings, in particular, they have been found to be detrimental to dynamic range and degrading to sensitivity, as well as being expensive to implement Against this background, the present invention aims to address the previously described drawbacks.

SUMMARY OF THE INVENTION

Accordingly, and in one aspect, the present invention provides a receiver for a portable radio communication apparatus comprising a first port for inputting a received frequency signal and a second port for inputting a local oscillator signal, means for rectifying the input local oscillator signal to provide a conductance waveform at a multiple of the local oscillator signal and means for mixing the received frequency signal with the conductance waveform at said multiple of the local oscillator signal frequency for down-converting the received frequency signal to an intermediate frequency signal.

By means of the invention, the received signal can be down converted without employing a local oscillator at the carrier frequency of the received signal.

Advantageously, the local oscillator can be fixed to operate at a sub-harmonic of the received signal frequency, and the mixing action is performed between the received frequency signal and one of the harmonics of the local oscillator, which advantageously ensures that the harmonic is not generated in the receiver. This is termed sub-harmonic mixing. Accordingly, the local oscillator signal frequency is far removed from received signal frequency, resulting in the mixer providing very high local oscillation to received signal isolation. This is because leakage of local oscillator radiation from the receiver to the antenna has negligible effect on other receivers in close proximity receiving on the same channel as the received signal. Thus, less shielding is necessary to inhibit interference signals generated by the local oscillator leaking out and interfering with adjacent apparatus than for a local oscillator near or at the radio frequency signal. Additionally, since no multiplying of the local oscillator is necessary the phase noise is not multiplied either.

The LO signal advantageously is split into two signals of opposite phase. This could be performed by a passive Balun structure or alternatively a ceramic or active splitter. A further advantage is that the local oscillator requires low power drive and thus benefits in reduced power consumption.

In a first embodiment of the present invention, the rectifying means and the coupling means comprise a balanced anti-phase output transformer and switching means, wherein a signal output from the transformer drives the switching means at a multiple of the local oscillator frequency.

The balanced anti-phase output transformer further improves isolation between the input (radio frequency) port and the local oscillator port. Optionally, the transformer may be a strip line, slot-line, co-planar microstrip and/or microstrip balanced to unbalanced transformer.

Preferably, the switching means comprises an anti-parallel diode pair, and respective diodes are electrically coupled to respective arms of the balanced output of the transformer, and suitably the diodes are Schottky diodes.

Advantageously, the switching means comprises a further anti-parallel diode pair, and respective diodes of the further anti-parallel pair are reversibly electrically coupled to respective arms of the balanced output of the transformer relative to the said anti-parallel diode pair. Such a dual anti-parallel diode pair configuration provides a higher balance between arms of the switching means than achievable with a single anti-parallel diode pair. This further improves isolation between the radio frequency and local oscillator ports.

In a second embodiment of the present invention, the rectifying means and the coupling means comprise a phase splitter and a plurality of transistors arranged in a network, wherein a signal output from the driver transistor drives the transistor network at a multiple of the local oscillator frequency.

The use of transistors in the second embodiment advantageously provides for the integration of the embodiment into an integrated circuit.

Preferably, the phase splitter provides anti-phase local oscillator drive signals to the plurality of transistors arranged in a network, and the driver transistor may comprise a unipolar transistor, conveniently an FET transistor, while the plurality of transistors arranged in a network may comprise bipolar transistors in a bridge configuration.

For this application of direct conversion receiver the local oscillator is half the received frequency.

The present invention extends to apparatus for a sub-harmonic mixer, comprising switching means, a first port for inputting a first frequency signal to the switching means, a transformer having an output electrically coupled to the switching means, and a second port for inputting a local oscillator signal to an input of the transformer, wherein a signal output from the transformer drives the switching means at an even multiple of the local oscillator frequency for down-converting the first signal frequency.

In a further aspect of the invention there is provided a method for sub-harmonically mixing a signal, comprising receiving a first frequency signal, generating a local oscillator signal and switching the first frequency signal at an even multiple of the local oscillator signal, for down-converting the first frequency signal.

BRIEF DESCRIPTION OF THE DRAWINGS

Specific embodiments in accordance with the invention are hereinafter described, by way of example only, and with reference to the accompanying drawings, in which:

FIGS. 1 and 3 show radio telephones 100 including sub-harmonic mixers in accordance with first and second embodiments of the invention respectively. The sub-harmonic mixers are adapted to be operable within a 840 MHz to 1080 MHz frequency range. The radio telephones 100 include all the usual functional elements associated with radio telephones, such as a key pad, display, microphone, ear-piece, transceiver unit and a micro-controller to control all the functional elements.

DETAILED DESCRIPTION OF THE DRAWINGS

Figure 1:
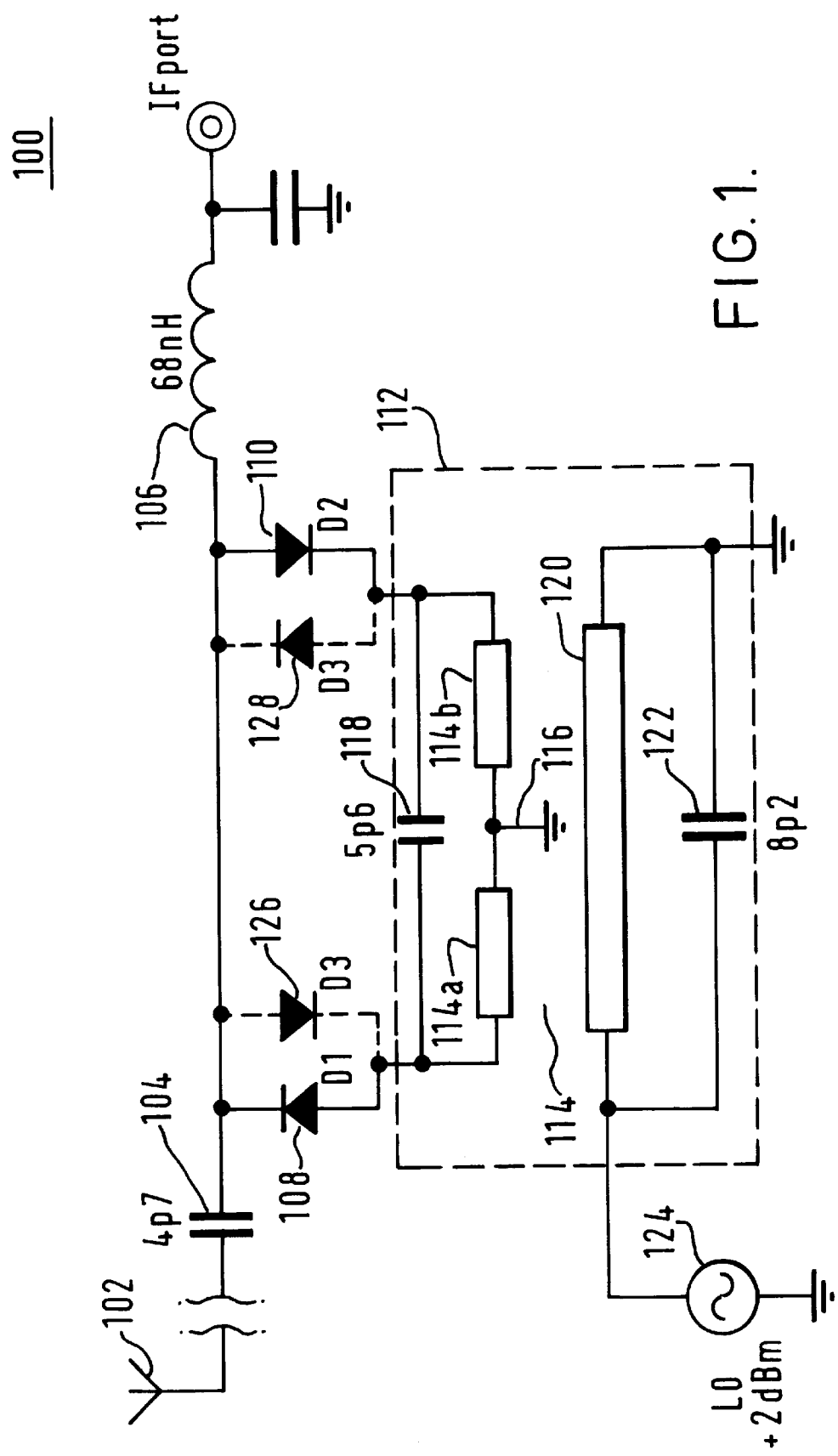
FIG. 1 schematically represents a first embodiment of a sub-harmonic mixer in accordance with the present invention.

Referring to FIG. 1, radio telephone 100 includes an antenna 102, typically capable of receiving and transmitting radio frequency signals. Antenna 102 is coupled to a transceiver comprising a transmitter and receiver, but the sub-harmonic mixer forms a part of a receiver.

A 4.7 picofarad capacitor 104 decouples the mixer from the input for the radio frequency carrier signal. Decoupling capacitor 104 is series coupled to a 68 nH inductor 106, which acts as a low-pass output filter. An anti-parallel diode pair comprising Schottky diodes D1 and D2, references 108 and 110 respectively, is parallel coupled between capacitor 104 and inductor 106. The anti-parallel pair D1, D2 is also coupled to the balanced output of balanced-to-unbalanced (Balun) transition 112.

Balun 112 comprises a balanced stripline output 114 having respective sub-sections 114a and 114b centred about an earth reference potential 116. A 5.6 picofarad tuning capacitor 118 is coupled across balanced output 114. Transformer Balun 112 further comprises unbalanced stripline input 120, having an 8.2 picofarad tuning capacitor 122 coupled across it. A local oscillator signal LO is coupled to the unbalanced input from local oscillator generator 124. A typical LO output power level is 2 dBm. The balanced output 114 produces anti-phased signals in respective arms 114a and 114b. Local oscillator generator 124 supplies an LO signal to the unbalanced input 120 of Balun 112. The LO signal is coupled to balanced output 114. A voltage $V_{1LO}(t)$ is applied across the terminals of D1 (108), and a voltage $V_{2LO}(t)$ is applied across the terminals of D2 (110). Voltage $V_{1LO}(t)$ is shown schematically in FIG. 2 and is labelled reference 202, and $V_{2LO}(t)$ is reference 210 (dotted). The conductance waveforms $g_1(t)$, $g_2(t)$ for D1 (108) and D2 (110) are shown labelled 204/206 respectively in FIG. 2.

Figure 2:
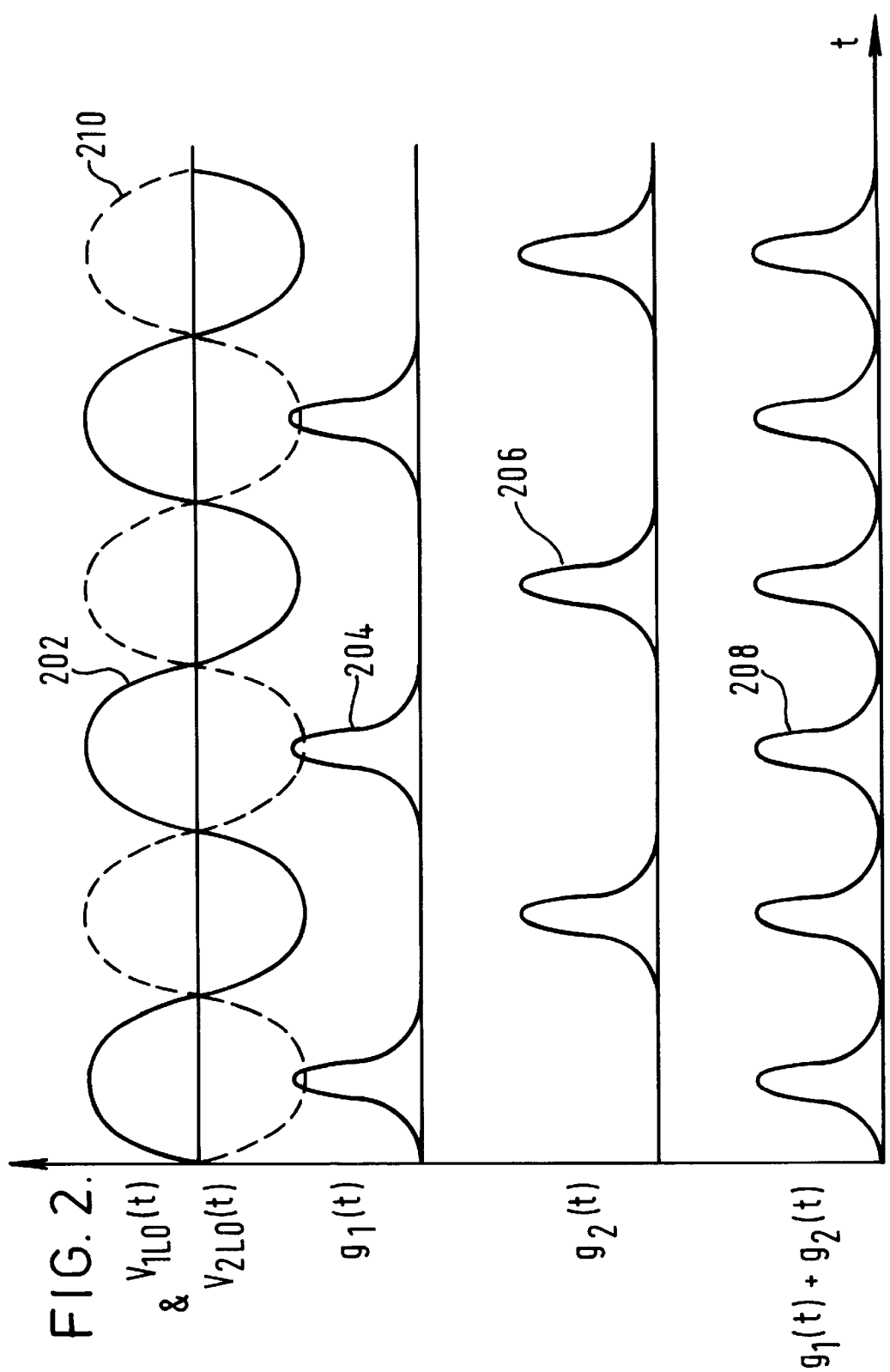
FIG. 2 schematically shows the correspondence of the local oscillator voltage across diodes D1 and D2, and the respective and combined conductance waveforms for D1 and D2 for the embodiment described with reference to FIG. 1.

The combined conductance waveform $g_1(t)+g_2(t)$ is shown labelled 208 in FIG. 2. As can be seen from FIG. 2, the combined conductance waveform 208 has a frequency which is twice that of the local oscillator signals 202 and 210 respectively produced at arms 114a and 114b.

Referring back to FIG. 1, the conductance waveform 208 of anti-parallel diode pair D1/D2 (108, 110) causes switching of the radio frequency carrier signal input across capacitor 104 at a rate twice that of the LO signal. This is achieved by coupling the radio frequency carrier signal to ground in accordance with waveform 208. Switching the radio frequency signal in this manner down converts it to a frequency given by the difference in frequency between the radio frequency signal fRF, and twice the local oscillator frequency $2f_{LO}$. It is apparent to a person of ordinary skill in the art that the fundamental response also includes a signal at the sum (fRF+$2f_{LO}$) of the frequencies. The sum and other higher order products are not relevant to the described embodiment, and are attenuated by low-pass filter 106, and capacitor.

By selecting the LO frequency, $f_{Lo}$, to be half the radio frequency, $f_{RF}$, direct conversion is possible. For the embodiment of FIG. 1, the LO frequency would be in the range 420 MHz to 540 MHz. Since the LO pump fundamental is half $f_{RF}$, there is very little 2×LO signal generated directly from the mixing process (at $f_{RF}$) (i.e. 2nd harmonic frequency of the LO frequency). Due to the second harmonic's naturally low power level and the selective filtering inherent in the VCO, the second harmonic is at a much lower power level than the fundamental frequency. Additionally, since the fundamental frequency is not multiplied and the harmonic (i.e. twice LO frequency) component is filtered, the phase noise remains substantially constant. Furthermore, a high phase balance between respective anti-phased arms 114a and 114b reduces generation of signals at the second harmonic of the LO.

Balun 112 need not be stripline, but may be another Balun transition. However, it is important that the respective signals produced at 114a and 114b are very well phase-balanced. Discrete balluns lend themselves to high levels of phase balance, and are the preferred embodiment. In general, the circuit components for the sub-harmonic pumped mixer shown in FIG. 1 are chosen and configured to give a high level of phase and amplitude balance across the arms of the anti-diode parallel pair. This optimises the isolation from antenna 102. For example, diodes D1/D2 (108, 110) are fabricated from the same area of wafer during their manufacture.

Figure 3:
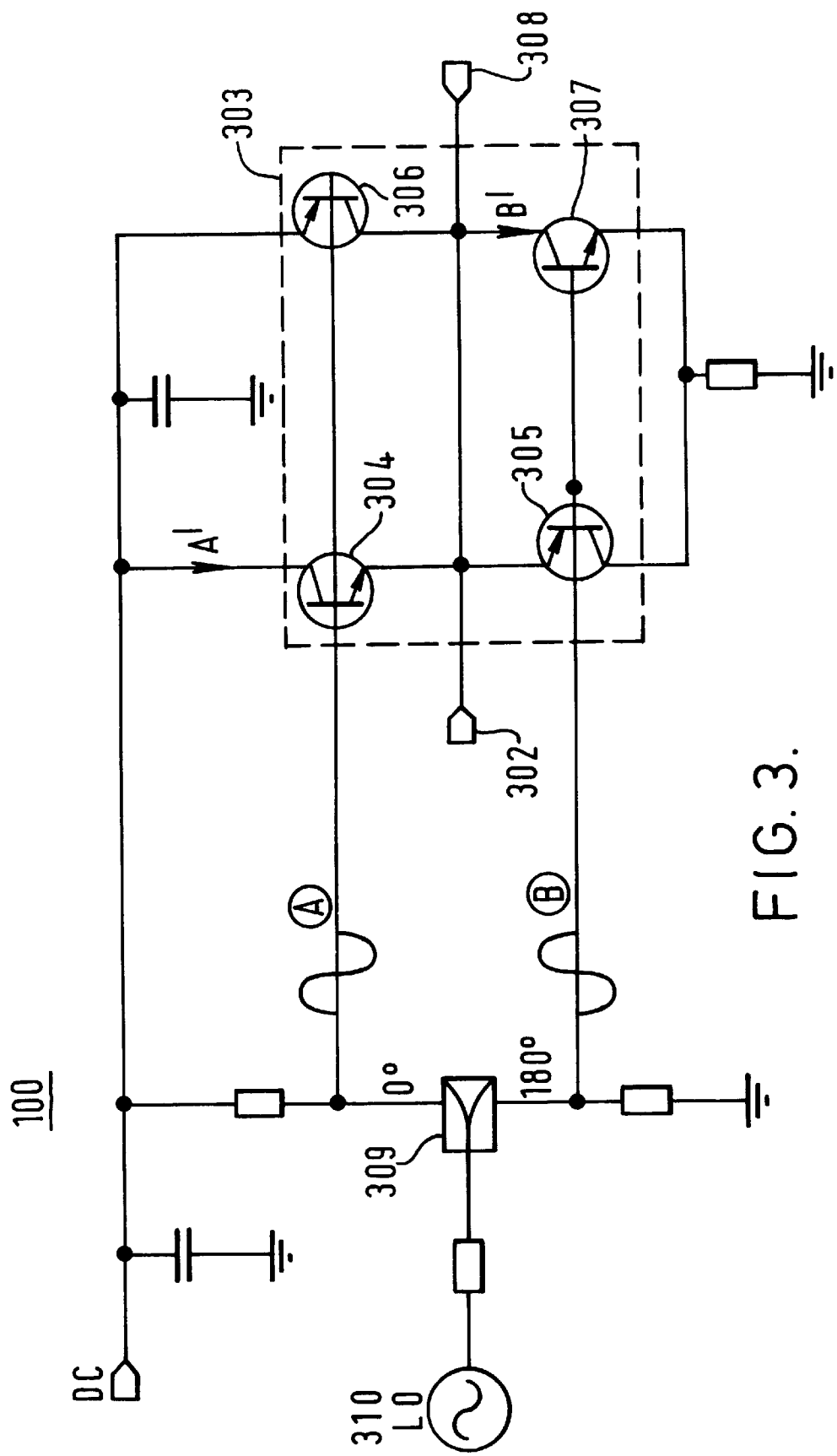
FIG. 3 schematically represents a second embodiment of a sub-harmonic mixer in accordance with the present invention.

Turning to FIG. 3, there is shown a schematic circuit for the second embodiment of a sub-harmonic mixer of the present invention forming part of a receiver of a radio telephone 100. The radio telephone 100 includes an antenna 302, coupled to a transceiver and capable of receiving and transmitting radio frequency signals.

In the receiver, the antenna 302 is connected at an input of a transistor network 303 comprising four transistors 304, 305, 306, 307, and an intermediate frequency (IF) port 308 is connected at an output of the network 303.

The transistors 304, 305, 306, 307 are bipolar transistors arranged generally in a bridge configuration; transistors 304 and 307 are NPN transistors, transistors 305 and 306 are PNP transistors.

The antenna 302 and IF port 308 are coupled to the transistor network 303 between the emitter of transistor 304 and the collector of transistor 305, and between the emitter of transistor 306 and the collector of transistor 307. A constant DC voltage supply is connected to the respective collectors of transistors 304 and 306, and respective emitters of transistors 305 and 307 are connected to ground. The respective bases of the transistors are connected to a phase splitter 309.

The 0 degrees phase shifted LO signal is connected to the bases of transistors 304 and 306, and the 180 degrees phase shifted LO signal is connected to the bases of the transistors 305 and 307.

The operation of the circuit will now be described.

Local oscillator generator 310 operating at half that required for mixing supplies an LO signal to the phase splitter 309. Phase splitter 309 generates two signals, one in-phase another in anti-phase local oscillator drive signals to transistors 304, 306, and 305 307 respectively. During the in-phase LO signal on its positive half cycle is applied to transistors 304 and 306, transistor 304 conducts and transistor 306 is switched off. During the in-phase LO signal on its negative half cycle is applied to transistors 304 and 306, transistor 304 is switched off and transistor 306 conducts. During the anti-phase LO signal is on its positive half cycle, transistor 307 conducts and transistor 305 is off. During the anti-phase LO signal is on its negative half cycle, transistor 307 is off and transistor 305 conducts. Since the in phase and anti-phase signals are 180 degrees phase shifted on the positive half-cycle of the local oscillator drive, transistors 304 and transistors 305 are on. On the negative half-cycle of the local oscillator drive, transistors 306 and transistors 307 are on. In either case, the antenna and IF port is connected to a virtual earth when a pair of transistors conduct. Since there are two pairs of transistors driven on opposite half-cycles, the summing point is driven close to ground on both half-cycles hence the mixer switches in the same sense at twice the local oscillator frequency.

Figure 4:
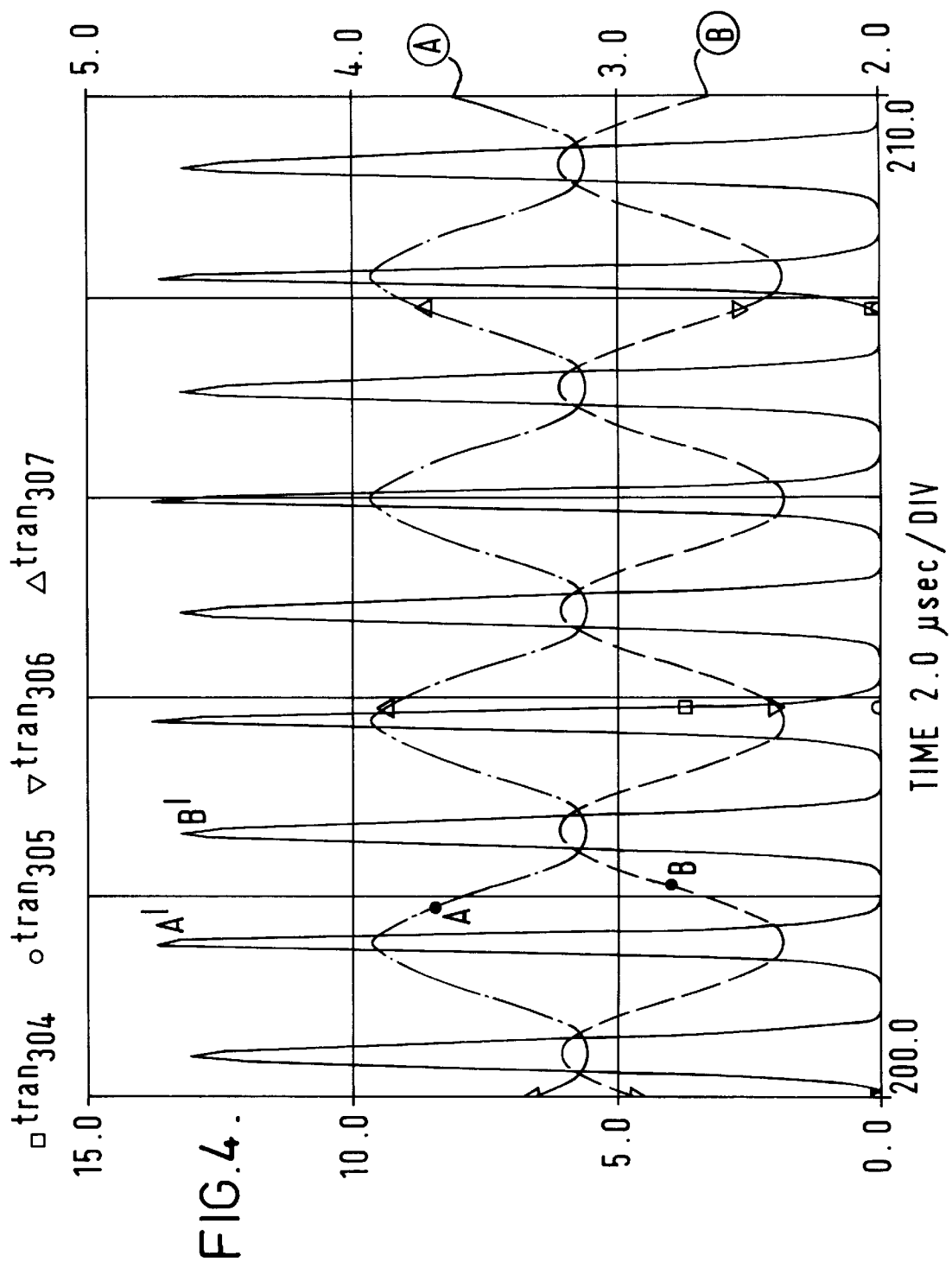
FIG. 4 schematically shows the voltage waveforms of the local oscillator and IF ports of the second embodiment.

FIG. 4 illustrates the conductance of the transistor network in relation to the phase of the LO. It shows two opposite phase signals and the conductance of A the in-phase LO applied to transistors 304 and 306, and B the LO applied antiphase to transistors 305 and 307. A' is the current through the 304 and 305 transistor pair. B' is the current through 306 and 307 transistor pair. It shows that during every half cycle of the applied LO the subharmonic mixer switches. See FIG. 3 for correspondence of A A' and B B'.

In view of the foregoing description it will be evident to a person skilled in the art that various modifications may be made within the scope of the invention. For example, dual anti-parallel diode pairs may be utilised, further comprising diodes D3/D4 (126, 128) and shown dotted in FIG. 1. This further improves phase and amplitude balance, thereby further improving isolation from antenna 102. Additionally, the invention is not limited to down-converting carried signal frequencies for control signals, but is applicable to downconverting in general.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during prosecution of this application or of any such further application derived therefrom.

What is claimed is:

1. A receiver for a portable radio communication apparatus comprising:
   a first port for inputting a received frequency signal;
   a second port for inputting a local oscillator signal; means for rectifying the input local oscillator signal to provide a conductance waveform at a multiple of the local oscillator signal, wherein the rectifying means and a coupling means comprise:
      a phase splitter and a plurality of transistors arranged in a network, wherein a signal output from a driver transistor drives the transistor network at a multiple of the local oscillator frequency; and
   means for mixing the received frequency signal with the conductance waveform at said multiple of the local oscillator signal frequency for down-converting the received frequency signal to an intermediate frequency signal.

2. A receiver according to claim 1, wherein the rectifying means and the coupling means comprise a transformer and switching means, wherein a signal output from the transformer drives the switching means at a multiple of the local oscillator frequency.

3. A receiver according to claim 2, wherein the transformer comprises a balanced anti-phase output.

4. A receiver according to claim 3, wherein the switching means comprises an anti-parallel diode pair, and respective diodes are electrically coupled to respective arms of the balanced output of the transformer.

5. A receiver according to claim 4, wherein the switching means comprises a further anti-parallel diode pair, and respective diodes of the further anti-parallel pair are reversibly electrically coupled to respective arms of the balanced output of the transformer relative to the said anti-parallel diode pair.

6. A receiver according to claim 4, wherein the diodes are Schottky diodes.

7. A receiver according to claim 4, wherein the diodes are fabricated from the same region of semi-conductor wafer during manufacture.

8. A receiver according to claim 2, wherein the transformer is a discrete element.

9. Apparatus according to claim 2, wherein the transformer is a strip line, slot-line, co-planar microstrip and/or microstrip balanced to unbalanced transformer.

10. A receiver according to claim 1, wherein the phase splitter provides anti-phase local oscillator drive signals to the plurality of transistors arranged in a network.

11. Apparatus according to claim 1 for direct conversion receivers, wherein the local oscillator frequency is half the received frequency.

12. Apparatus for a sub-harmonically pumped mixer, comprising:
   switching means;
   a first port for inputting a first frequency signal to the switching means;
   a transformer having an output electrically coupled to the switching means; and
   a second port for inputting a local oscillator signal to an input of the transformer, wherein the transformer and the switching means comprise:
      a rectifying and coupling means to rectify the input local oscillator signal to provide a conductance waveform at a multiple of the local oscillator signal, wherein the rectifying and coupling means comprise:
         a phase splitter;
         a plurality of transistors arranged in a network;
   whereby a signal output from the transformer drives the switching means at an even multiple of the local oscillator frequency for down converting the first signal frequency.

13. A radio telephone comprising a receiver and/or operable in accordance with claim 1.

* * * * *